(12) United States Patent
Nonaka et al.

(10) Patent No.: US 6,647,615 B2
(45) Date of Patent: *Nov. 18, 2003

(54) PARTS MOUNTING SYSTEM

(75) Inventors: Satoshi Nonaka, Minamikoma-gun (JP); Hiroaki Kurata, Nakakoma-gun (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/765,669

(22) Filed: Jan. 22, 2001

(65) Prior Publication Data

US 2001/0001896 A1 May 31, 2001

Related U.S. Application Data

(62) Division of application No. 08/899,312, filed on Jul. 23, 1997, now Pat. No. 6,223,428.

(30) Foreign Application Priority Data

Aug. 7, 1995 (JP) ............................................. 7-200611

(51) Int. Cl.$^7$ ................................................ H05K 3/30
(52) U.S. Cl. ............................. 29/740; 29/743; 29/832; 700/95; 700/102
(58) Field of Search ......................... 29/740, 743, 832; 209/571, 573, 560, 561, 905, 919; 700/95, 99, 102

(56) References Cited

U.S. PATENT DOCUMENTS

| 5,044,069 A | | 9/1991 | Asai et al. |
| 5,193,268 A | | 3/1993 | Ono et al. |
| 5,224,325 A | * | 7/1993 | Takahashi et al. ............. 29/834 |
| 5,317,802 A | * | 6/1994 | Jyoko .......................... 29/832 |
| 5,400,497 A | | 3/1995 | Watanabe et al. |
| 5,740,604 A | | 4/1998 | Kitamura et al. |
| 5,987,613 A | * | 11/1999 | Busch et al. ................. 713/300 |

FOREIGN PATENT DOCUMENTS

JP   9-51193   2/1997

* cited by examiner

Primary Examiner—Richard Chang
(74) Attorney, Agent, or Firm—Parkhurst & Wendel, L.L.P.

(57) ABSTRACT

A parts mounting system includes a plurality of mounting units and a parts distributor unit for distributing parts to the mounting units. The parts distributor unit includes a specifying section for specifying types of parts that can be mounted by each of the mounting units, as division-specified parts, and a distributor section for sequentially distributing parts, based on the types of parts, from the parts other than the division-specified parts, to the mounting units. The distributor section sequentially distributes the division-specified parts to the mounting units so that the division-specified parts are divided thereby to reduce a difference in mounting time by each mounting unit after the parts other than division-specified parts are distributed.

6 Claims, 3 Drawing Sheets

PARTS MOUNTING SYSTEM

FIELD OF THE INVENTION

The present invention relates to a parts distributing method for distributing electronic parts to mounting units in a mounting system which comprises a plurality of parts mounting units connected thereto for mounting the electronic parts on a printed circuit board and a mounting system which carries out the parts distributing method.

BACKGROUND OF THE INVENTION

In the recent years where diversified kinds of electronic parts are fed in diversified modes and a larger number of electronic parts are mounted on each printed circuit board in the field of electronic parts mounting, it is often practiced to manufacture a printed circuit board with a parts mounting system which comprises a plurality of mounting units for electronic parts of plural kinds or a single kind.

Employed as a method to prepare operating instruction data for mounting units for electronic parts ("operating instruction data for the mounting units for the electronic parts" will hereinafter be referred to simply as mounting data) is a method for preparing mounting data by inputting such data as on location, dimension and the like of the electronic parts to a CAD system intended for designing a printed circuit board for mounting electronic parts, in an attempt to prepare mounting data efficiently and with higher precision.

In order to operate a plurality of mounting units for electronic parts ("the mounting units for electronic parts" will hereinafter be referred to simply as mounting units) with high efficiency by equalizing mounting time with each mounting unit as much as possible, however, it is necessary to employ a method for determining which parts are to be distributed to which mounting units.

Description will be made of a method for distributing electronic parts to the mounting units in a known electronic parts mounting system.

1. In mounting data for a single printed circuit board, an electronic part of a kind specified for a specific mounting unit ("the electronic part which is specified for a specific mounting unit" will hereinafter be referred to simply as a fixed part) is distributed to the specified mounting unit and such a distribution is repeated until no fixed part remains.

2. Then, a mounting time of each mounting unit to which the fixed parts have been distributed is calculated, and a mounting time for each remaining kind of electronic parts is calculated by multiplying a number of the parts by a mounting time for each single part.

3. Then, an electronic part which is calculated to have the maximum mounting time is distributed to a mounting unit having the minimum mounting time, and such a distribution is repeated until no electronic part remains.

Thus, all the electronic parts are distributed to the mounting units such that each unit will have an equalized mounting time.

However, the foregoing known parts distributing method poses problems which are described below.

This method allows electronic parts of one kind to be distributed only to a single mounting unit. Therefore, when the kinds of electronic parts to be mounted on a single printed circuit board is in a small number and there are a large number of electronic parts of a same kind, it is hard to sufficiently equalize the mounting time of each mounting unit.

DISCLOSURE OF THE INVENTION

It is therefore a primary object of the present invention to solve the above-described problems and to provide a parts distributing method which is capable of equalizing a mounting time with each mounting unit and a mounting system for carrying out said method.

For accomplishing this object, the present invention provides a parts distributing method for distributing parts to mounting units in a mounting system having a plurality of mounting units, said method comprising the steps of: specifying parts which can be mounted with each of the mounting units as division-specified parts; distributing parts specified for a specific mounting unit to the mounting unit; repeating operations to distribute parts having a maximum mounting time, out of remaining parts other than the division-specified parts, to the mounting units which sequentially have a minimum mounting time; and repeating operations to distribute the division-specified parts one by one to the mounting units which sequentially have a minimum mounting time.

According to the configuration described above, the parts distributing method of the present invention is capable of reducing variations in parts mounting time among the mounting units by specifying the specific parts as the division-specified parts and finally distributing said division-specified parts one by one to the parts mounting units.

DESCRIPTION OF THE EMBODIMENTS

Now, embodiments of the parts distributing method and the mounting system according to the present invention will be described with reference to FIGS. 1 through 3.

Figure 1:
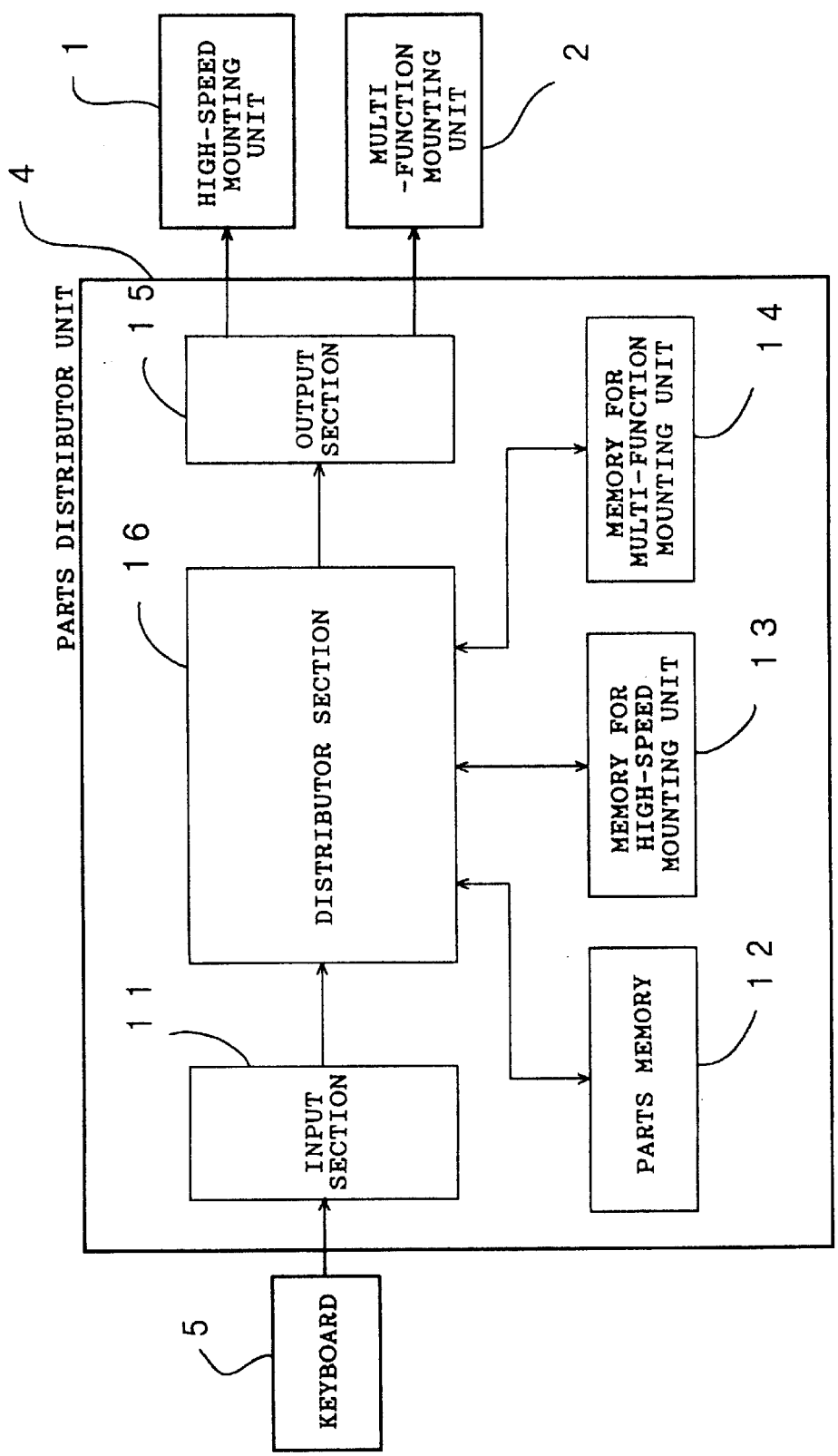
FIG. 1 is a block diagram illustrating an electronic parts mounting system in an embodiment of the present invention.
Figure 2:
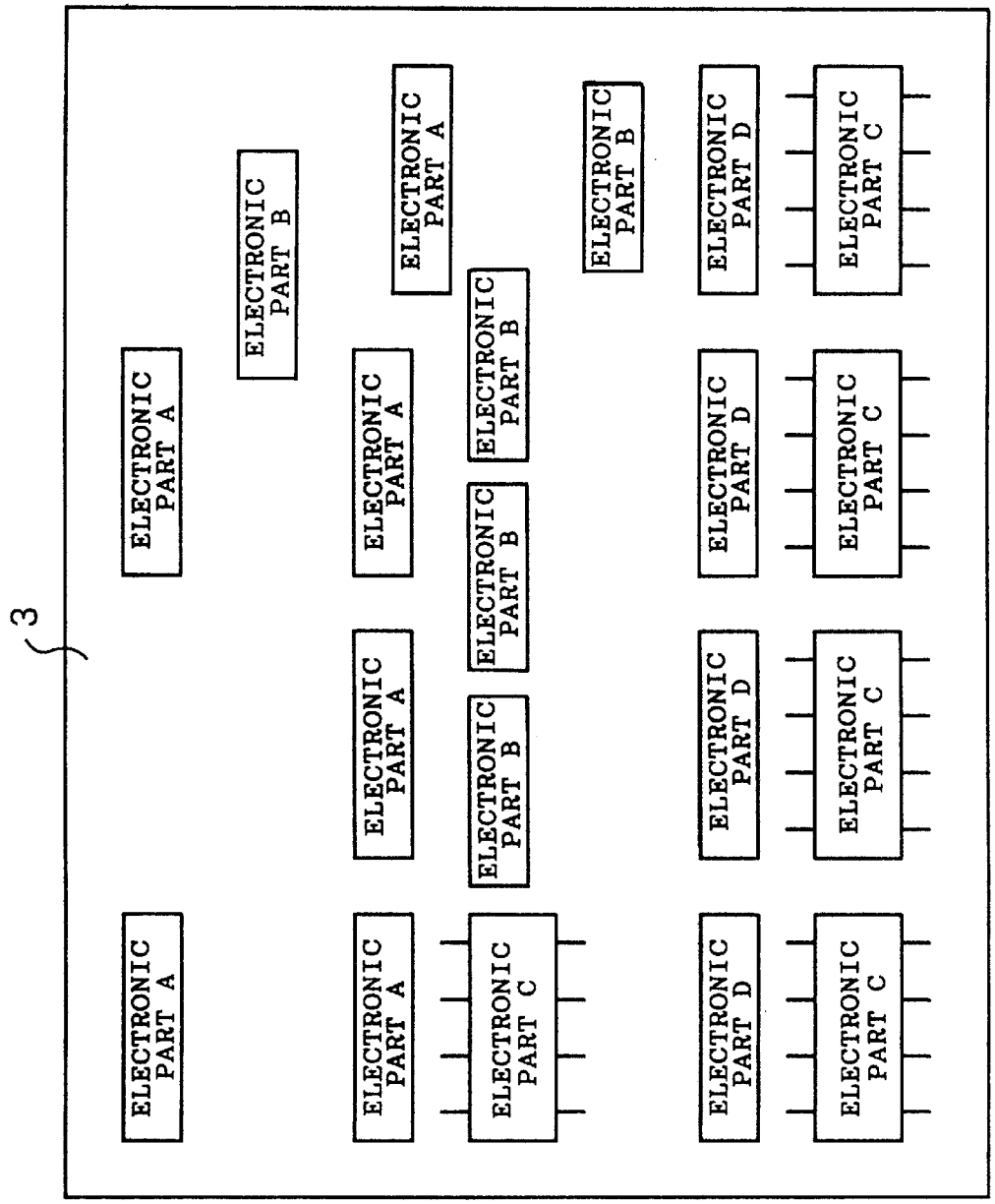
FIG. 2 is a plan view illustrating a printed circuit board on which electronic parts are to be mounted in the embodiment of the present invention.
Figure 3:
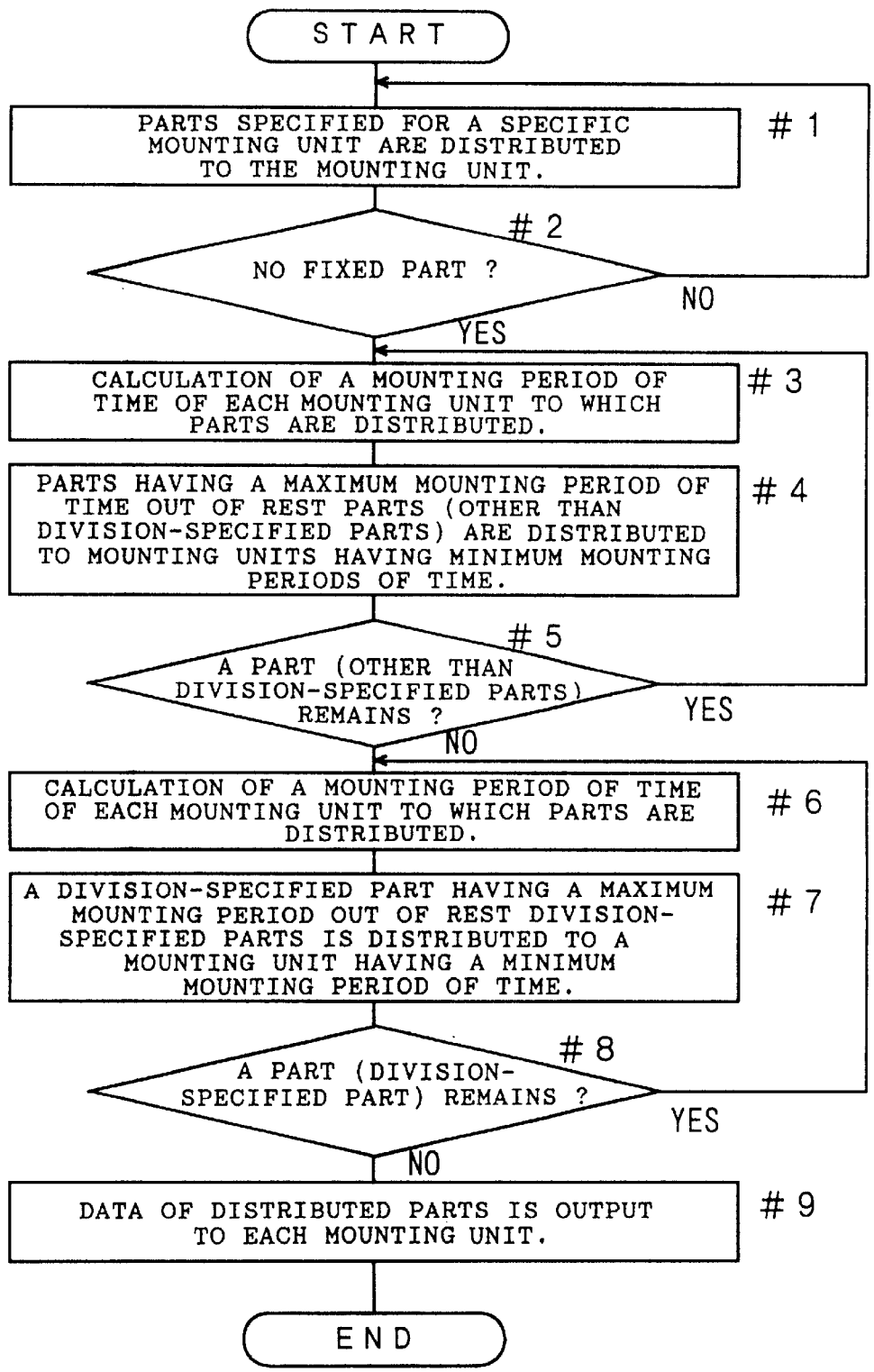
FIG. 3 is a flow chart illustrating an electronic parts distributing method employed in the embodiment of the present invention.

The electronic parts mounting system has an electronic parts mounting unit 1 for mounting specific small electronic parts at high speeds ("the electronic parts mounting unit for mounting specific small electronic parts at a high speed" will hereinafter be referred to simply as a high-speed mounting unit) and an electronic parts mounting unit 2 capable of mounting various electronic parts having special forms ("the electronic parts mounting unit capable of mounting various electronic parts having special forms" will hereinafter be referred to simply as a multi-function mounting unit), which are connected to the system as shown in FIG. 1, and further comprises a parts distributor unit 4 which generates "distribution data" for distributing a plurality of electronic parts to be mounted on a single printed circuit board 3 as shown in FIG. 2 between the high-speed mounting unit 1 and the multi-function mounting unit 2, and a keyboard 5 which inputs data of the electronic parts to be mounted on the printed circuit board 3 into the parts distributor unit 4. The plurality of electronic parts to be mounted on the printed circuit board 3 are shared between the high-speed mounting unit 1 and the multi-function mounting unit 2.

The parts distributor unit 4 is composed of a micro computer which comprises: an input section 11 into which data is input from the keyboard 5, a parts memory 12 which stores data of the plurality of electronic parts to be mounted on a single printed circuit board 3, that is, a number of electronic parts, kinds thereof and tacts (mounting time per electronic part) for each of the mounting units 1 and 2; a memory 13 for a high-speed mounting unit and a memory 14 for a multi-function mounting unit which respectively store the "distribution data" to be distributed to the mounting units 1 and 2; an output section 15 which outputs the distribution data stored in the memories 13 and 14 to the high-speed mounting unit 1 and the multi-function mounting unit 2 respectively, and a distributor section 16 which will be described later in detail.

Description will be made of mounting operations in which six electronic parts A, five electronic parts B, five electronic parts C and four electronic parts D are mounted on the printed circuit board 3 as shown in FIG. 2

The tacts employed for mounting the electronic parts A, B, C and D with the respective mounting unit 1 and 2 are summarized in Table 1. In Table 1: the electronic part A requires 0.15 second to be mounted with the high-speed mounting unit 1 and 0.25 second to be mounted with the multi-function mounting unit 2; the electronic part B requires 0.20 second to be mounted with the high-speed mounting unit 1 and 0.30 second to be mounted with the multi-function mounting unit 2; the electronic part C which has a special form and therefore can be mounted only with the multi-function mounting unit 2 requires 0.40 second to be mounted; and the electronic part D requires 0.15 second to be mounted with the high-speed mounting unit 1 and 0.25 second to be mounted with the multi-function mounting unit 2.

The data on parts to be mounted on the printed circuit board 3 described above is input into the distributor section 16 by manipulating the keyboard 5 and stored into the parts memory 12 by the distributor section 16. The electronic parts A which are used in a large number and can be mounted with either of the mounting units 1 and 2 are preliminarily set as "divisible" in the parts memory 12 as division data by manipulating the keyboard 5.

Procedure for distributing the electronic parts A, B, C and D in the distributing section 16 to the mounting units 1 and 2 in the conditions described above will be explained with reference to the flow chart shown in FIG. 3.

First, the distributor section 16 distributes fixed parts to the mounting units 1 and 2 based on the parts data for the printed circuit board 3 stored in the parts memory 12. In this embodiment, the five electronic parts C which can be mounted only with the multi-function mounting unit 2 are distributed to the multi-function mounting unit 2 and stored in the memory 14 for the multi-function mounting unit (step #1). Though only one kind of fixed parts are specified for the mounting units 1 and 2 in this embodiment, this step is repeated until no fixed part remains when plural kinds of fixed parts are specified for the mounting units (step #2).

Then, the time for mounting the electronic parts distributed in steps #1 and #2 are calculated (step #3). In this embodiment wherein five electronic parts C are to be mounted with the multi-function mounting unit 2, the mounting time of the multi-function mounting unit 2 is set at 0.4×5=2.0 seconds.

Then, electronic parts which have a maximum value of time obtained by multiplying the number of the parts by a mounting time per electronic part (the electronic parts B in this embodiment, since the electronic parts B require a mounting time of 5×0.2=1 and the electronic parts D require a mounting time of time of 4×0.15=0.6), out of the remaining electronic parts other than the division-specified parts which are preliminarily set as "divisible" as division data (electronic parts other than the electronic parts A, that is, the electronic parts B and D), are distributed to a mounting unit having the shortest mounting time as a result of adding every mounting time for each mounting part which has been distributed at the step #1 to the mounting time calculated at the step #3 (the mounting unit 1 which has a mounting time of 0) and stored in a memory (the memory 13 for the mounting unit 1 which has the mounting time of 0) (step #4).

At step #5, the part distributor unit 4 judges whether or not there is a remaining electronic part other than the division-specified parts. In this embodiment wherein the electronic parts D remain, the parts distributor unit 4 returns to the step #3 and calculates a mounting time of each of the mounting units by totalizing the mounting time for the distributed electronic parts. Speaking concretely, the mounting unit 1 which mounts the electronic parts B has a mounting time of 5×0.2=1 second, whereas the mounting unit 2 which mounts the electronic parts C has a mounting time of 5×0.4=2 seconds. At the next step #4, the parts distributor unit 4 distributes the remaining electronic parts (the electronic parts D) to the mounting unit which has the shortest mounting time (the mounting unit 1) and stores them in the memory (the memory 13 for the mounting unit 1 which has the mounting time of 0). The procedure described above is repeated until there remains no electronic part other than the division-specified parts.

When there remains no electronic part other than the division-specified parts, the part distributor unit 4 calculates the mounting time of each mounting units 1 and 2 after the electronic parts described above have been distributed (step #6). In this embodiment, the mounting unit 1 which mounts the electronic parts B and D has a mounting time of 5×0.2+4×0.15=1.6 seconds and the mounting unit 2 which mounts the electronic parts C has a mounting time of 2 seconds as described above. On the basis of a difference in mounting time, the division-specified parts (electronic parts A) are distributed one by one to the mounting unit having a shorter mounting time (first to the mounting unit 1 which has the mounting time of 1.6 seconds) and stored in the memory (first in the memory 13 for the mounting unit 1 which has the mounting time of 1.6 seconds) (step #7). Until the parts distributor unit 4 judges that no division-specified electronic part remains at step #8, it repeats the operations to return to the step #6 for calculating the mounting time of the mounting unit by adding a mounting time per distributed electronic part and distributes an electronic part to the mounting unit which has a shortest mounting time at the step #7, thereby distributing all remaining division-specified electronic parts. Thus all the electronic parts are distributed to the mounting units. When the first through third electronic parts A have been distributed sequentially to the mounting unit 1 in this embodiment, the mounting unit 1 has a mounting time of 1.6+0.15×3=2.05 seconds which is longer than that of the mounting time of 2.0 seconds of the mounting unit 2. Then, the next fourth electronic part A is distributed to the mounting unit 2, and then the mounting unit 2 has a mounting time of 2.0+0.25=2.25 seconds. Then, the fifth electronic part A is distributed to the mounting unit 1, and then the mounting unit 1 has a mounting time of 2.20 seconds, so that the last sixth electronic part A is distributed to the mounting unit 1.

As a result, the mounting unit 1 is set to mount five electronic parts A, the electronic parts B and the electronic parts D. Whereas, the mounting unit 2 is set to mount one electronic part A and the electronic parts C. In this case, the mounting unit 1 has a mounting time of 2.35 seconds and the mounting unit 2 has a mounting time of of 2.25 seconds.

In the conventional example wherein the electronic parts A, B and D are mounted with the mounting unit 1 and the electronic parts C are mounted with the mounting unit 2, the mounting unit 1 has a mounting time of 2.5 seconds and the mounting unit 2 has a mounting time of 2.0 seconds, thereby producing a large variation between the mounting times and rendering the mounting efficiency to be lower than that in the embodiment of the present invention.

When all data associated with the electronic parts A, B, C and D are distributed to the memories 13 and 14, respectively for the mounting unit 1 and the mounting unit 2, the distribution data stored in these memories 13 and 14 is output to the output section 15 which outputs the distribution data to each of the mounting units 1 and 2 (at step #9) to complete the procedure.

Exemplified in the above-described embodiment, for simplicity of description, is a mounting system which includes two mounting units, that is, the high-speed mounting unit 1 and the multi-function mounting unit 2. It is needless to say, however, that the present invention is applicable to a mounting system which includes three or more mounting units.

As clear from the foregoing description, it is possible to reduce a variation between mounting times of the mounting units 1 and 2 for efficient operations of these mounting units by way of preliminarily specifying specific electronic parts as division-specified parts, first distributing a fixed part specified for a specific mounting unit to said mounting unit, sequentially repeating operations to distribute a part having a maximum mounting time, out of remaining parts other than the division-specified part, to the mounting unit which sequentially has a minimum mounting time, and finally distributing the division-specified parts one by one to each of the mounting units.

TABLE I

| Part name | Quantity | Tacts for high-speed mounting unit | Tacts for multi-function mounting unit |
|---|---|---|---|
| Electronic Part A | 6 | 0.15 | 0.25 |
| Electronic Part B | 5 | 0.20 | 0.30 |
| Electronic Part C | 5 | — | 0.40 |
| Electronic Part D | 4 | 0.15 | 0.25 |

Tact: mounting time per part (sec.)

What is claimed is:

1. A parts mounting system, comprising:
   at least one high-speed parts mounting unit;
   at least one multi-function mounting unit for mounting parts having a plurality of different forms, said multi-function unit having a parts mounting speed less than a parts mounting speed of the high-speed parts mounting unit; and
   a parts distributor unit for preparing distribution data indicating parts to be distributed to each mounting unit, said parts distributor unit comprising:
      an input section for inputting parts data corresponding to parts to be distributed to each parts mounting unit;
      a first memory for storing data received from the input section;
      a second memory for storing distribution data; and
      a distributor section connected to said at least one high-speed mounting unit and said at least one multi-function mounting unit, said distributor section comprising:
         means for detecting data identifying division-specified parts;
         first means for storing in said second memory, distribution data for batch distribution of non-division-specified parts of a same type to each parts mounting unit;
         means for calculating a difference in mounting time among the mounting units;
         second means for storing in said second memory, distribution data for distributing division-specified parts sequentially one at a time to a parts mounting units having a shortest mounting time according to the calculated difference; and
         means for repeating operation of said means for calculating a difference and said second means for storing distribution data, until no division-specified parts data remain.

2. The parts mounting system of claim 1, further comprising a keyboard for inputting parts data and dividable parts data.

3. A parts distributor unit for preparing distribution data for indicating parts to be distributed to at least one high-speed mounting unit and to at least one multi-function mounting unit for mounting parts having a plurality of different forms, said multi-function unit having a parts mounting speed less than a parts mounting speed of the high-speed parts mounting unit, said parts distributor unit comprising:
   an input section for inputting parts data corresponding to parts to be distributed to each parts mounting unit;
   a first memory for storing data from the input section;

a second memory for storing distribution data; and a distributor section connected to at least one high-speed mounting unit and at least one multi-function mounting unit, said distributor section comprising:

means for detecting data identifying division-specified parts;

first means for storing in said second memory distribution data for batch distribution of non-division-specified parts of a same type to each parts mounting unit;

means for calculating a difference in mounting time among mounting units;

second means for sequentially storing in said second memory distribution data for distributing division-specified parts sequentially one at a time to a parts mounting unit having a shortest mounting time according to the calculated difference; and means for repeating operation of said means for calculating a difference and said second means for storing distribution data, until no division-specified parts data remain.

4. The parts distributor unit of claim 3, wherein said distributor section is for:

first distributing parts specific to a respective mounting unit to said respective mounting unit, calculating a first mounting time for parts distributed to each said respective mounting unit, second distributing parts that are non-division-specified parts and require a maximum mounting time, to a parts mounting unit having a minimum first mounting time, calculating a second mounting time for said each of the mounting units after said first and second distributing parts, and sequentially distributing division-specified parts one by one to a mounting unit having a minimum mounting time, and repeating said calculating a second mounting time and sequentially distributing until no division-specified parts remain.

5. The parts distributor unit of claim 3, wherein said distributor section designates parts that are used in large quantity and mountable to each mounting unit as division-specified parts.

6. The parts distributor unit of claim 3, wherein said second memory for storing distribution data comprises a memory for high-speed mounting and a memory for multi-function mounting.

* * * * *